United States Patent
Watanabe et al.

(10) Patent No.: US 7,948,284 B2
(45) Date of Patent: May 24, 2011

(54) POWER-ON RESET CIRCUIT

(75) Inventors: Kotaro Watanabe, Chiba (JP); Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/695,480

(22) Filed: Jan. 28, 2010

(65) Prior Publication Data
US 2010/0188124 A1 Jul. 29, 2010

(30) Foreign Application Priority Data
Jan. 29, 2009 (JP) .................... 2009-018247

(51) Int. Cl.
*H03L 7/00* (2006.01)
(52) U.S. Cl. ........................... 327/143; 327/142
(58) Field of Classification Search .................. 327/142, 327/143
See application file for complete search history.

(56) References Cited

U.S. PATENT DOCUMENTS

| | | | | |
|---|---|---|---|---|
| 5,130,569 A | * | 7/1992 | Glica | 327/143 |
| 5,477,176 A | * | 12/1995 | Chang et al. | 327/143 |
| 6,566,919 B2 | * | 5/2003 | Nguyen | 327/143 |
| 6,747,492 B2 | * | 6/2004 | Govil et al. | 327/143 |

FOREIGN PATENT DOCUMENTS
JP 11-068539 A 3/1999
* cited by examiner

*Primary Examiner* — Hai L Nguyen
(74) *Attorney, Agent, or Firm* — Brinks Hofer Gilson & Lione

(57) ABSTRACT

Provided is a power-on reset circuit suitable for a semiconductor device that operates at a low supply voltage. When a supply voltage (VDD) becomes higher than a first output circuit reversal threshold voltage (Vz) after a reset signal is output, a first control circuit (51) operates so that the reset signal is not output. With an appropriate circuit design in which the first output circuit reversal threshold voltage (Vz) is low, the output and stop of the reset signal is enabled at the low supply voltage (VDD).

7 Claims, 4 Drawing Sheets

POWER-ON RESET CIRCUIT

RELATED APPLICATIONS

This application claims priority under 35 U.S.C. §119 to Japanese Patent Application No. 2009-018247 filed on Jan. 29, 2009, the entire content of which is hereby incorporated by reference.

BACKGROUND OF THE INVENTION

1. Field of the Invention

The present invention relates to a power-on reset circuit that outputs a reset signal when a supply voltage reaches a given voltage.

2. Description of the Related Art

A conventional power-on reset circuit is described. FIG. 4 is a diagram illustrating the conventional power-on reset circuit.

When a supply voltage VDD increases from 0 V, voltages of internal nodes N1 and N2 are also initially 0 V. When the supply voltage VDD becomes higher than a threshold voltage of an inverter 47, an output voltage VOUT becomes high, and the power-on reset circuit outputs a reset signal. Further, when the supply voltage VDD becomes higher than an absolute value of a threshold voltage of a PMOS transistor 41, the PMOS transistor 41 turns on, and the voltage of the internal node N1 becomes equal to the supply voltage VDD.

After that, when the supply voltage VDD further increases, the voltage of the internal node N1 also increases. However, the voltage of the internal node N1 is clamped to a total voltage (for example, 2Vtp) of absolute values of PMOS transistors 42 and 43. After that, when the supply voltage VDD becomes higher than a total voltage (for example, 3Vtp) of a threshold voltage (for example, Vtp) of a PMOS transistor 44 and the foregoing total voltage (for example, 2Vtp), the PMOS transistor 44 turns on, and the voltage of the internal node N2 becomes equal to the supply voltage VDD. The output voltage VOUT of the inverter 47 becomes low, and the power-on reset circuit stops outputting the reset signal.

After that, when the supply voltage VDD becomes low, and the supply voltage VDD becomes lower than a voltage resulting from subtracting an absolute value of a threshold voltage of a PMOS transistor 45 from the voltage of the internal node N2, the PMOS transistor 45 turns on. Then, the voltage of the internal node N2 becomes a voltage resulting from adding the absolute value of the threshold voltage of the PMOS transistor 45 to the supply voltage VDD. Hence, when the supply voltage VDD becomes 0 V, the voltage of the internal node N2 becomes equal to the absolute value of the threshold voltage of the PMOS transistor 45.

In this state, in the case where the supply voltage VDD becomes high again, when the supply voltage VDD becomes higher than a total voltage of the absolute values of the threshold voltages of the PMOS transistor 45 and the inverter 47, the power-on reset circuit outputs the reset signal (for example, refer to JP 11-068539 A).

However, in the related art, the power-on reset circuit continues to output the reset signal while the supply voltage VDD is lower than the total voltage of the absolute values of the threshold voltages of the PMOS transistors 42 and 44 after the power-on reset circuit outputs the reset signal. Hence, the power-on reset circuit cannot be applied to a semiconductor device that operates at supply voltage lower than the foregoing total voltage.

SUMMARY OF THE INVENTION

The present invention has been made in view of the above-mentioned problems, and therefore has an object to provide a power-on reset circuit suitable for a semiconductor device that operates at a lower supply voltage.

In order to solve the above-mentioned problems, according to the present invention, provided is a power-on reset circuit that outputs a reset signal when a supply voltage reaches a first given voltage, including: a first output circuit including a first PMOS transistor and a first current source, the first output circuit controlling a first control circuit having a first output circuit reversal threshold voltage; a second output circuit including a second PMOS transistor and a second current source, the second output circuit having the first given voltage which is a second output circuit reversal threshold voltage lower than the first output circuit reversal threshold voltage and operating so that the reset signal is output when the supply voltage becomes higher than the first given voltage; a first source follower circuit that is applied with a reference voltage lower than the second output circuit reversal threshold voltage, and outputs a voltage based on the reference voltage to an input terminal of the first control circuit; a second source follower circuit that is applied with the reference voltage, and outputs the voltage based on the reference voltage to a gate of the first PMOS transistor and a gate of the second PMOS transistor; the first control circuit including a first capacitor, the first control circuit operating so that the first capacitor starts to be charged when the supply voltage becomes higher than the first output circuit reversal threshold voltage and the reset signal is not output after a given period of time has elapsed; and a second control circuit including a second capacitor, the second control circuit connecting the second capacitor to the gate of the first PMOS transistor and the gate of the second PMOS transistor when the supply voltage is lower than a second given voltage.

According to the present invention, when the supply voltage becomes higher than a total voltage of the reference voltage and the second output circuit reversal threshold voltage, the reset signal is output. Further, the reference voltage is lower than the second output circuit reversal threshold voltage, and hence the reset signal is accurately output if the supply voltage of the semiconductor device is higher than the total voltage even though the supply voltage is lower than twice as large as the second output circuit reversal threshold voltage.

Further, when the supply voltage becomes higher than the first output circuit reversal threshold voltage after the reset signal has been output, the first control circuit operates so as not to output the reset signal. The circuit is appropriately designed so that the first output circuit reversal threshold voltage is low, and hence the circuit operates at the supply voltage lower than that of the conventional art.

DETAILED DESCRIPTION OF THE PREFERRED EMBODIMENT

Hereinafter, an embodiment of the present invention is described with reference to the accompanying drawings.

Figure 1:
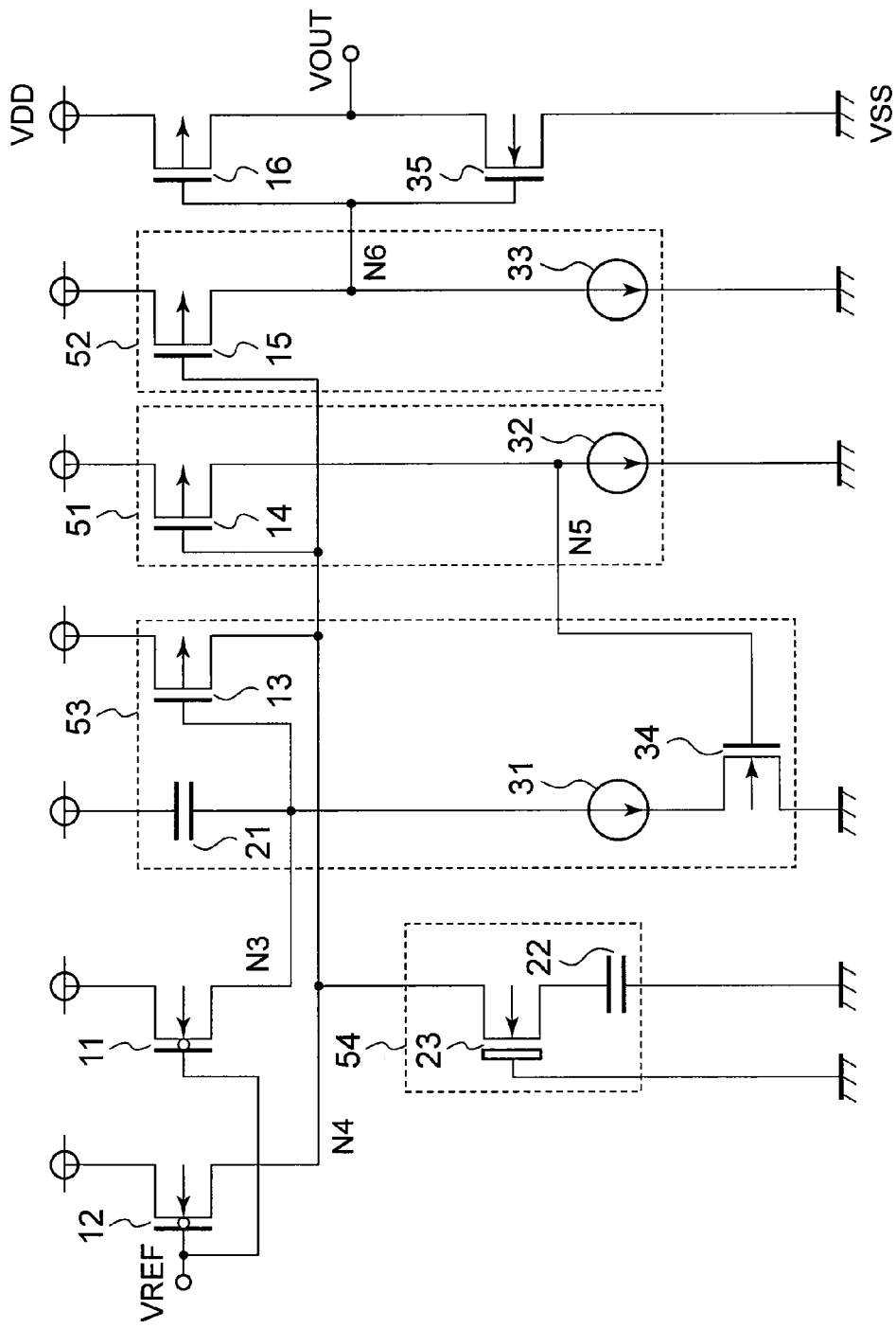
FIG. 1 is a diagram illustrating a power-on reset circuit.

First, a configuration of a power-on reset circuit is described. FIG. 1 is a diagram illustrating a power-on reset circuit.

The power-on reset circuit includes NMOS transistors 11 and 12, PMOS transistors 13, 14, 15, and 16, capacitors 21 and 22, a depletion type (D-type) NMOS transistor 23, current sources 31, 32, and 33, and NMOS transistors 34 and 35. Further, the power-on reset circuit includes internal nodes N3, N4, N5, and N6.

In this example, the PMOS transistor 14 and the current source 32 are an inverter using the current source 32, and constitute a first output circuit 51. The PMOS transistor 15 and the current source 33 are an inverter using the current source 33, and constitute a second output circuit 52. The NMOS transistor 11 constitutes a first source follower circuit. The NMOS transistor 12 constitutes a second source follower circuit. The NMOS transistor 34, the capacitor 21, the current source 31, and the PMOS transistor 13 constitute a first control circuit 53. The D-type NMOS transistor 23 and the capacitor 22 constitute a second control circuit 54.

The NMOS transistor 11 has a gate connected to a reference voltage terminal, a source connected to the internal node N3, and a drain connected to a supply terminal. The NMOS transistor 12 has a gate connected to the reference voltage terminal, a source connected to the internal node N4, and a drain connected to the supply terminal. The PMOS transistor 13 has a gate connected to the internal node N3, a source connected to the supply terminal, and a drain connected to the internal node N4. The PMOS transistor 14 has a gate connected to the internal node N4, a source connected to the supply terminal, and a drain connected to the internal node N5. The PMOS transistor 15 has a gate connected to the internal node N4, a source connected to the supply terminal, and a drain connected to the internal node N6. The PMOS transistor 16 has a gate connected to the internal node N6, a source connected to the supply terminal, and a drain connected to an output terminal.

The capacitor 21 is disposed between the supply terminal and the internal node N3. The capacitor 22 is disposed between a source of the D-type NMOS transistor 23 and a ground terminal. The D-type NMOS transistor 23 has a gate connected to the ground terminal, and a drain connected to the internal node N4. The current source 31 is disposed between the internal node N3 and a drain of the NMOS transistor 34. The current source 32 is disposed between the internal node N5 and the ground terminal. The current source 33 is disposed between the internal node N6 and the ground terminal. The NMOS transistor 34 has a gate connected to the internal node N5, and a source connected to the ground terminal. The NMOS transistor 35 has a gate connected to the internal node N6, a source connected to the ground terminal, and a drain connected to the output terminal.

The NMOS transistors 34 and 35 have a threshold voltage Vtn, and the NMOS transistors 11 and 12 have a threshold voltage Vtni lower than Vtn. The PMOS transistors 13, 14, 15, and 16 have a threshold voltage Vtp. The D-type NMOS transistor 23 has a threshold voltage Vtnd.

The first output circuit 51 has a first output circuit reversal threshold voltage Vz1, and controls the first control circuit 53. The second output circuit 52 has a second output circuit reversal threshold voltage Vz2 lower than the first output circuit reversal threshold voltage Vz1, and operates so that the reset signal is output when the supply voltage VDD becomes higher than the second output circuit reversal threshold voltage Vz2. The first source follower circuit is applied with a reference voltage VREF lower than the second output circuit reversal threshold voltage Vz2, and outputs a voltage (VREF−Vtni) to an input terminal of the first control circuit 53 when operating as a source follower circuit. The second source follower circuit is applied with the reference voltage VREF, and outputs the voltage (VREF−Vtni) to the gates of the PMOS transistors 14 and 15 when operating as a source follower circuit. The first control circuit 53 operates to start the charging of the capacitor 21 so that the reset signal is not output after a given period of time has been elapsed when the supply voltage VDD becomes higher than the first output circuit reversal threshold voltage Vz1. The second control circuit 54 connects the capacitor 22 to the gates of the PMOS transistors 14 and 15 when the supply voltage VDD is lower than a voltage −Vtnd.

The first output circuit reversal threshold voltage Vz1 is determined on the basis of the drive performances of the PMOS transistor 14 and the current source 32 and the threshold voltage Vtp of the PMOS transistor 14. Further, the second output circuit reversal threshold voltage Vz2 is determined on the basis of the drive performances of the PMOS transistor 15 and the current source 33 and the threshold voltage Vtp of the PMOS transistor 15.

Figure 2:
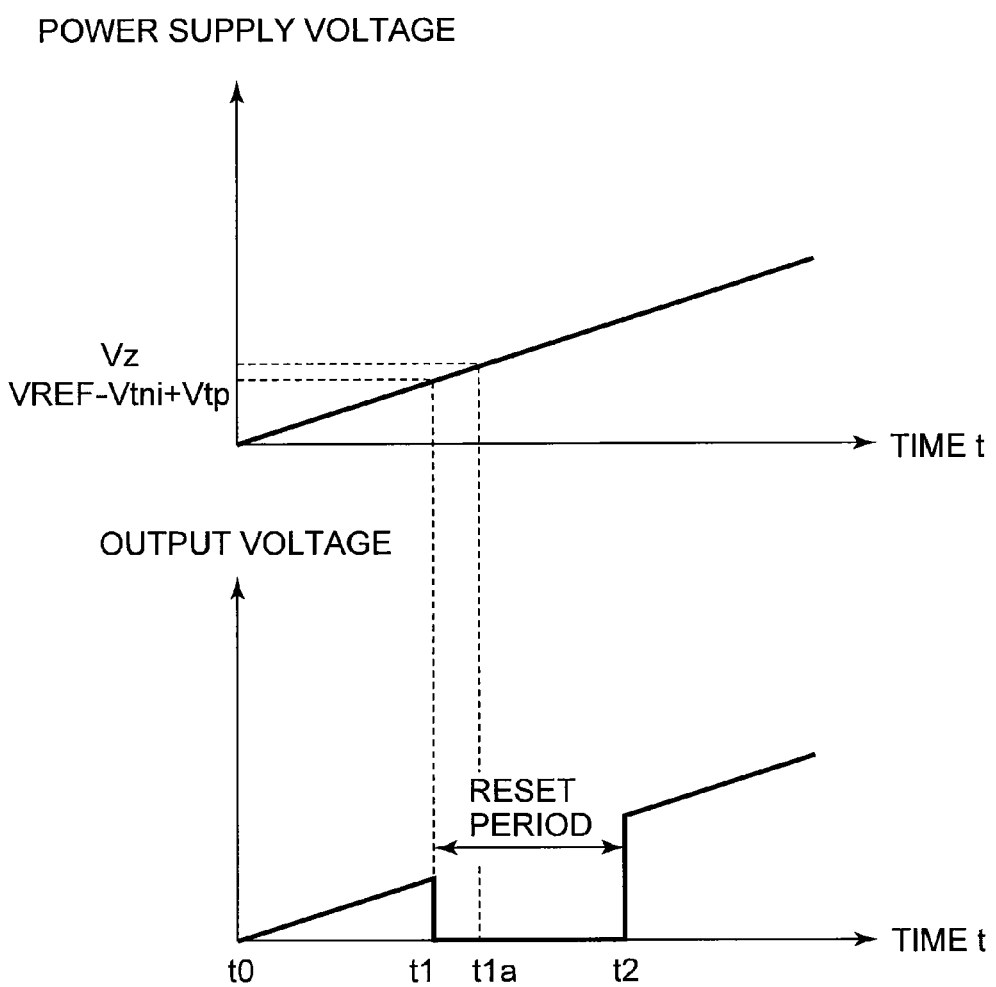
FIG. 2 is a timing chart illustrating a supply voltage and an output voltage.

Subsequently, the operation of the power-on reset circuit when the supply voltage VDD gradually increases is described. FIG. 2 is a timing chart illustrating a supply voltage and an output voltage.

In a period of $t0 \leq t < t1$, the NMOS transistor 12 operates as a source follower circuit. The reference voltage VREF is applied to the reference voltage terminal, and hence the voltage of the internal node N4 becomes equal to a voltage (VREF−Vtni). In this state, the supply voltage VDD gradually increases, but is lower than the reversal threshold voltages of the first output circuit and the second output circuit. Therefore, the PMOS transistors 14 and 15 turn off, and the voltage of the internal node N6 is low. Hence, the output voltage VOUT is going to be high, and gradually increases to follow the supply voltage VDD. That is, the power-on reset circuit outputs no reset signal. Further, the NMOS transistor 34 also turns off, and hence the internal node N3 gradually increases to follow the supply voltage VDD by the coupling voltage of the capacitor 21.

At t=t1, when the supply voltage VDD becomes higher than the second output circuit reversal threshold voltage Vz2, the PMOS transistor 15 turns on, and the voltage of the internal node N6 becomes high. Hence, the output voltage VOUT becomes low, and the power-on reset circuit outputs the reset signal.

In a period of t1<t<t2, the supply voltage VDD further increases and reaches the first output circuit reversal threshold voltage Vz1 (time t reaches time t1a), not only the PMOS transistor 15 but also the PMOS transistor 14 turns on. Then, the voltage of the internal node N5 becomes high, and the NMOS transistor 34 turns on. Then, the NMOS transistor operates as a source follower circuit, the capacitor 21 is charged, and the voltage of the internal node N3 decreases. At this time (reset period), the output voltage VOUT remains low, and the power-on reset circuit remains to output the reset signal.

At t=t2, when the voltage of the internal node N3 becomes lower than a voltage resulting from subtracting an absolute value |Vtp| of the threshold voltage of the PMOS transistor 13 from the supply voltage VDD, the PMOS transistor 13 turns on, and the voltage of the internal node N4 becomes equal to the supply voltage VDD. Then, the PMOS transistors 14 and 15 turn off, and the voltages of the internal nodes N5 and N6 become low. Hence, the output voltage VOUT becomes high, and the power-on reset circuit outputs no reset signal, and completes the reset operation. Further, the NMOS transistor 34 turns off, and the charging of the capacitor 21 is completed to maintain the capacity. Hence, the voltage of the internal node N3 is kept to a voltage (VDD−Vtp) or lower, and the PMOS transistor 13 continues to be on. Further, although described later, the D-type NMOS transistor 23 also turns off, and the NMOS transistor 12 does not operate as a source follower circuit and does not decrease the potential of the internal node N4. Hence, no reset signal is output. As a result, in the MOS transistors except for the PMOS transistor 16 at an output stage in the power-on reset circuit, a current other than a leakage current does not flow.

In t>t2, the output voltage VOUT gradually increases to follow the supply voltage VDD. That is, the power-on reset circuit outputs no reset signal.

In this example, it is assumed that the supply voltage VDD is low, and the voltage of the internal node N4 is higher than the supply voltage VDD. In this case, the NMOS transistor 12 operates with the source as the supply terminal and the drain as the internal node N4. When a voltage resulting from subtracting the supply voltage VDD from the reference voltage VREF is higher than the threshold voltage Vtni of the NMOS transistor 12, the NMOS transistor 12 turns on, and the voltage of the internal node N4 becomes equal to the supply voltage VDD. For example, when it is assumed that the reference voltage VREF is 0.4 V, the supply voltage VDD is 0.2 V, the voltage of the internal node N4 is 1.0 V, and the threshold voltage Vtni is 0.2 V, the NMOS transistor 12 turns on, and the voltage of the internal node N4 becomes 0.2 V. Hence, the voltage of the internal node N4 is not higher than the supply voltage VDD, and hence the power-on reset circuit may normally operate even when power is on again.

Figure 3:
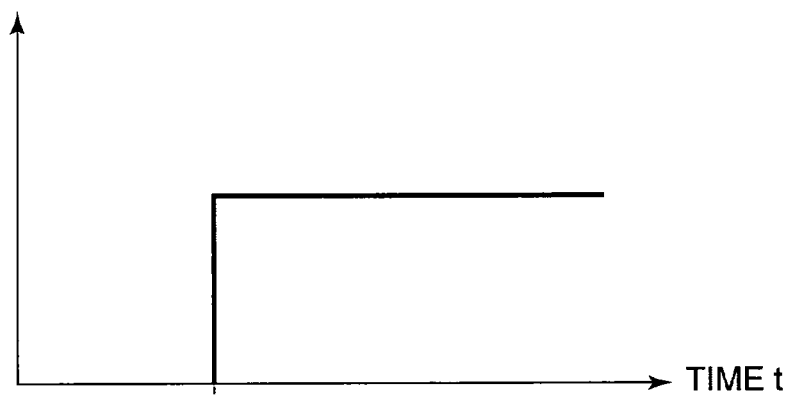
FIG. 3 is a timing chart illustrating the supply voltage and the output voltage.
Figure 3:
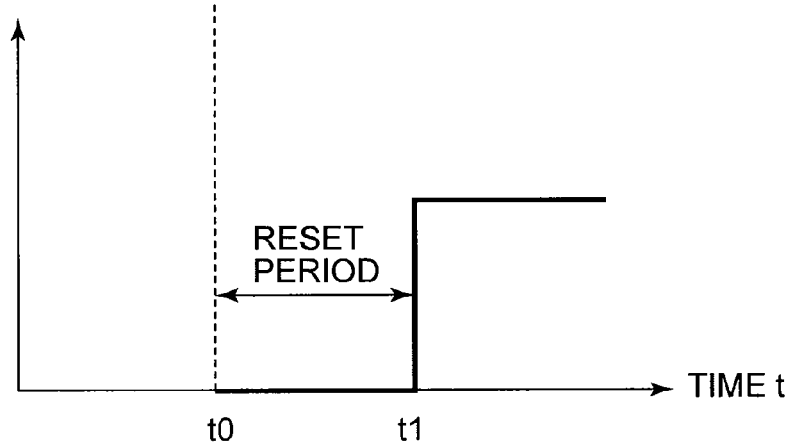
Figure 4:
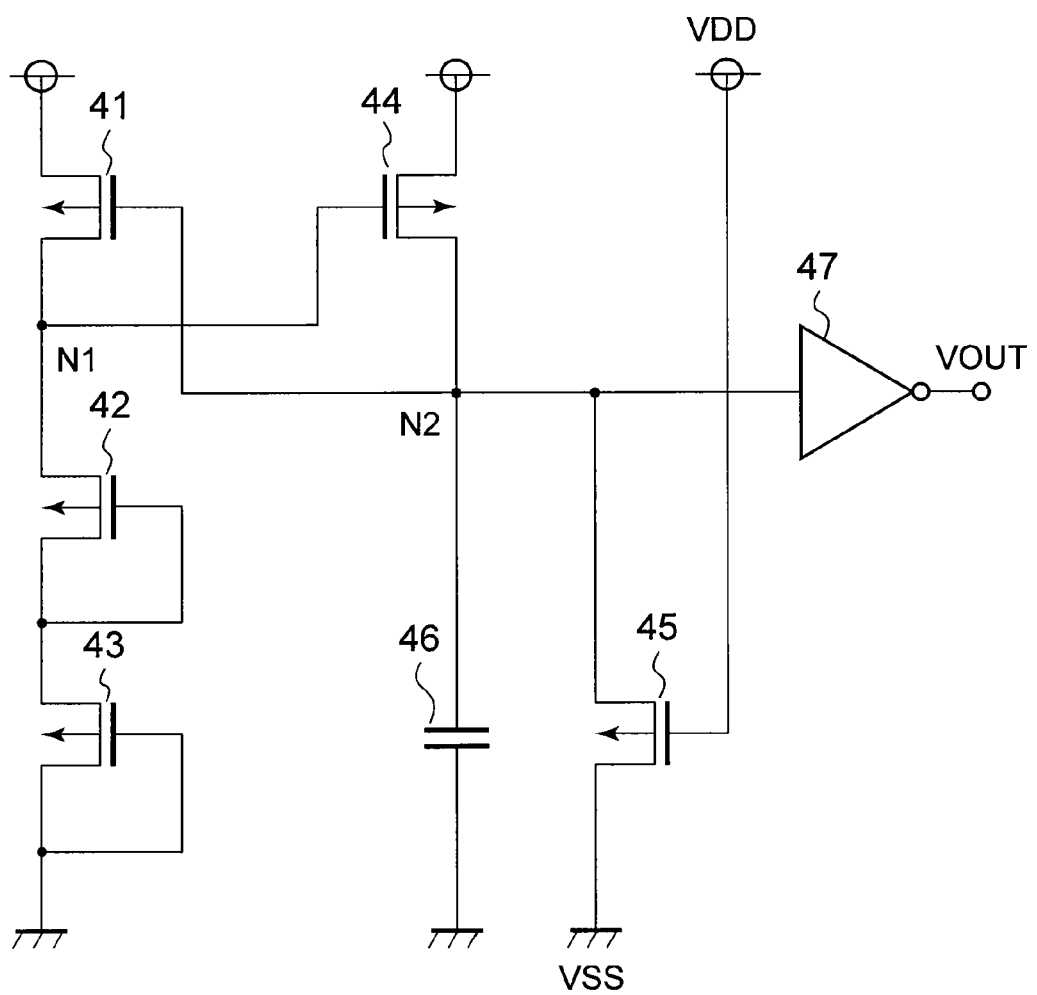
FIG. 4 is a diagram illustrating a conventional power-on reset circuit.

Subsequently, the operation of the power-on reset circuit when the supply voltage VDD becomes precipitously high is described. FIG. 3 is a timing chart illustrating the supply voltage and the output voltage.

At t=t0, when the supply voltage VDD becomes precipitously high, the voltage of the internal node N3 becomes precipitously high by coupling of the capacitor 21, to thereby turn off the PMOS transistor 13. Further, the D-type NMOS transistor 23 is on as described above, and hence the voltage of the internal node N4 is smoothed with respect to a ground voltage VSS by the capacitor 22, and the PMOS transistors 14 and 15 turn on. As a result, the voltages of the internal nodes N5 and N6 become high. Hence, the output voltage VOUT becomes low, and the power-on reset circuit outputs the reset signal. Further, the NMOS transistor 34 turns on, and the NMOS transistor operates as the source follower circuit, and the charging of the capacitor 21 starts.

In a period of t0<t<t1, by the charging of the capacitor 21, the voltage of the internal node N3 decreases. At this time (reset period), the output voltage VOUT remains low, and the power-on reset circuit remains to output the reset signal.

At t=t1, when the voltage of the internal node N3 becomes lower than a voltage resulting from subtracting the absolute value |Vtp| of the threshold voltage of the PMOS transistor 13 from the supply voltage VDD, the PMOS transistor 13 turns on, and the voltage of the internal node N4 becomes equal to the supply voltage VDD. Then, the PMOS transistors 14 and 15 turn off, and the voltages of internal nodes N5 and N6 become low. Hence, the output voltage VOUT becomes high and becomes equal to the supply voltage VDD. That is, the power-on reset circuit outputs no reset signal, and completes the reset operation. Further, the NMOS transistor 34 turns off, and the charging of the capacitor 21 is completed to maintain the capacity. Hence, the voltage of the internal node N3 is kept to a voltage (VDD−Vtp) or lower, and the PMOS transistor 13 continues to be on. Further, although described later, the D-type NMOS transistor 23 also turns off, and the NMOS transistor 12 does not operate as a source follower circuit, and does not decrease the potential of the internal node N4. Hence, no reset signal is output.

As a result, in the MOS transistors except for the PMOS transistor 16 at the output stage in the power-on reset circuit, a current other than a leakage current does not flow.

In t>t1, the output voltage VOUT is high and equal to the supply voltage VDD. That is, the power-on reset circuit outputs no reset signal.

In the case where the voltage of the internal node N4 is higher than −Vtnd when it is assumed that the threshold voltage of the D-type NMOS transistor 23 is Vtnd because the supply voltage VDD is higher than a given voltage, the D-type NMOS transistor 23 operates as a source follower circuit, and the source voltage of the D-type NMOS transistor 23 changes to −Vtnd from the ground voltage VSS, and a gate-source voltage of the D-type NMOS transistor 23 becomes equal to a threshold voltage (Vtnd). Therefore, the D-type NMOS transistor 23 turns off, and the capacitor 22 is not connected to the internal node N4. After that, when the supply voltage VDD precipitously increases, the voltage of the internal node N4 is not smoothed with respect to the ground voltage VSS by the capacitor 22, and the voltage of the internal node N4 follows the supply voltage VDD. Therefore, the PMOS transistor 15 does not turn on. Then, the voltage of the internal node N6 becomes low, the output voltage VOUT becomes high, and the reset signal is not output. Hence, when the supply voltage VDD is higher than the given voltage, and thereafter the supply voltage VDD becomes precipitously high, no reset signal is output.

Further, in the case where the voltage of the internal node N4 is lower than −Vtnd because the supply voltage VDD is lower than a given voltage, the gate-source voltage of the D-type NMOS transistor 23 becomes higher than the threshold voltage (Vtnd), the D-type NMOS transistor 23 turns on, and the capacitor 22 is connected to the internal node N4. After that, even though the supply voltage VDD precipitously increases, the voltage of the internal node N4 is smoothed with respect to the ground voltage VSS by the capacitor 22, and the voltage of the internal node N4 does not follow the supply voltage VDD. Therefore, the PMOS transistor 15 turns on. Then, the voltage of the internal node N6 becomes high, the output voltage VOUT becomes low, and the reset signal is output. Hence, when the supply voltage VDD is lower than the given voltage, and thereafter the supply voltage VDD becomes precipitously high, the reset signal is output.

With the above-mentioned configuration, the second output circuit reversal threshold voltage Vz2 can be determined according to the parameters of the PMOS transistor 15 and the constant voltage circuit 31, and the reference voltage VREF lower than the absolute value |Vtp| of the threshold voltage Vtp of the PMOS transistor 15, and can be readily made lower than 2Vtp. Hence, when the supply voltage of a semiconductor device is higher than the second output circuit reversal threshold voltage Vz2 even if the supply voltage is lower than the voltage 2Vtp, the reset signal is accurately output.

Further, when the supply voltage VDD becomes higher than the first output circuit reversal threshold voltage Vz1 after the reset signal has been output, the first control circuit 51 operates so that no reset signal is output. The supply voltage VDD may be low when the circuit is appropriately designed so that the first output circuit reversal threshold voltage Vz1 is low.

Further, even when the supply voltage VDD becomes gradually high or precipitously high, when the supply voltage VDD becomes higher than the second output circuit reversal threshold voltage Vz2, the reset signal is output.

Further, when the reset operation has been completed, no current other than the leakage current flows in the MOS transistors other than the PMOS transistor 16 at the output stage in the power-on reset circuit. Hence, the current consumption of the power-on reset circuit is reduced.

What is claimed is:

1. A power-on reset circuit that outputs a reset signal when a supply voltage reaches a first given voltage, comprising:
    a first output circuit comprising a first PMOS transistor and a first current source, the first output circuit controlling a first control circuit having a first output circuit reversal threshold voltage;
    a second output circuit comprising a second PMOS transistor and a second current source, the second output circuit having the first given voltage which is a second output circuit reversal threshold voltage lower than the first output circuit reversal threshold voltage and operating so that the reset signal is output when the supply voltage becomes higher than the first given voltage;
    a first source follower circuit that is applied with a reference voltage lower than the second output circuit reversal threshold voltage, and outputs a voltage based on the reference voltage to an input terminal of the first control circuit;
    a second source follower circuit that is applied with the reference voltage, and outputs the voltage based on the reference voltage to a gate of the first PMOS transistor and a gate of the second PMOS transistor;
    the first control circuit comprising a first capacitor, the first control circuit operating so that the first capacitor starts to be charged when the supply voltage becomes higher than the first output circuit reversal threshold voltage and the reset signal is not output after a given period of time has elapsed; and
    a second control circuit comprising a second capacitor, the second control circuit connecting the second capacitor to the gate of the first PMOS transistor and the gate of the second PMOS transistor when the supply voltage is lower than a second given voltage.

2. A power-on reset circuit according to claim 1, wherein the first output circuit comprises an inverter using the first current source.

3. A power-on reset circuit according to claim 1, wherein the second output circuit comprises an inverter using the second current source.

4. A power-on reset circuit according to claim 1, wherein the first control circuit comprises:
    a first NMOS transistor having a gate connected to an output terminal of the first output circuit, and a source connected to a ground terminal;
    the first capacitor and a third current source that are connected in series between a supply terminal and a drain of the first NMOS transistor in the stated order; and
    a third PMOS transistor having a gate connected to a node between the first capacitor and the third current source, a source connected to the supply terminal, and a drain connected to the gate of the first PMOS transistor and the gate of the second PMOS transistor.

5. A power-on reset circuit according to claim 1, wherein the second control circuit comprises:
    a depletion type NMOS transistor having a gate connected to a ground terminal, and a drain connected to the gate of the first PMOS transistor and the gate of the second PMOS transistor; and
    the second capacitor that is disposed between the source of the depletion type NMOS transistor and the ground terminal.

6. A power-on reset circuit according to claim 1, wherein the first source follower circuit comprises a second NMOS transistor having a threshold voltage lower than the threshold voltage of a first NMOS transistor, a gate connected to a reference voltage terminal, a source connected to an output terminal, and a drain connected to a supply terminal.

7. A power-on reset circuit according to claim 1, wherein the second source follower circuit comprises a third NMOS transistor having a threshold voltage lower than the threshold voltage of a first NMOS transistor, a gate connected to a reference voltage terminal, a source connected to an output terminal, and a drain connected to a supply terminal.

* * * * *